(12) United States Patent
Finley et al.

(10) Patent No.: US 7,361,404 B2
(45) Date of Patent: *Apr. 22, 2008

(54) COATED ARTICLE WITH REMOVABLE PROTECTIVE COATING AND RELATED METHODS

(75) Inventors: James J. Finley, Pittsburgh, PA (US); James P. Thiel, Allison Park, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 43 days.

This patent is subject to a terminal disclaimer.

(21) Appl. No.: 11/017,155

(22) Filed: Dec. 20, 2004

(65) Prior Publication Data

US 2005/0153126 A1     Jul. 14, 2005

Related U.S. Application Data

(63) Continuation-in-part of application No. 09/567,934, filed on May 10, 2000, now Pat. No. 6,849,328.

(51) Int. Cl.
*B32B 9/00* (2006.01)

(52) U.S. Cl. ............... 428/408; 428/336; 428/432; 428/697; 428/698; 428/701; 428/702

(58) Field of Classification Search ................ 428/408, 428/426, 432, 336, 697, 698, 701, 702
See application file for complete search history.

(56) References Cited

U.S. PATENT DOCUMENTS

| | | | |
|---|---|---|---|
| 3,652,246 A | 3/1972 | Michelotti et al. | 65/181 |
| 3,997,693 A * | 12/1976 | Kircher | 65/60.3 |
| 4,060,660 A | 11/1977 | Carlson et al. | 428/408 |
| 4,149,929 A | 4/1979 | Ladany | 156/668 |
| 4,315,947 A | 2/1982 | Todd, Jr. et al. | 426/250 |
| 4,351,861 A | 9/1982 | Henery | 427/255.1 |
| 4,444,802 A * | 4/1984 | Winters et al. | 106/14.13 |
| 4,444,803 A * | 4/1984 | Winters et al. | 106/14.15 |
| 4,479,981 A * | 10/1984 | Winters et al. | 106/14.13 |
| 4,504,109 A | 3/1985 | Taga et al. | 350/1.6 |
| 4,512,473 A | 4/1985 | Thomaswick et al. | 206/454 |
| 4,517,242 A | 5/1985 | Sinha et al. | 428/336 |
| 4,610,771 A | 9/1986 | Gillery | 204/192.1 |
| 4,612,058 A | 9/1986 | Geke et al. | 134/38 |
| 4,710,426 A | 12/1987 | Stephens | 428/336 |
| 4,716,086 A | 12/1987 | Gillery et al. | 428/630 |
| 4,719,126 A | 1/1988 | Henery | 427/165 |
| 4,746,347 A | 5/1988 | Sensi | 65/94 |
| 4,792,536 A | 12/1988 | Pecorar et al. | 501/70 |
| 4,806,220 A | 2/1989 | Finley | 204/192.27 |
| 4,834,857 A | 5/1989 | Gillery | 204/192.27 |
| 4,853,257 A | 8/1989 | Henery | 427/166 |
| 4,898,789 A | 2/1990 | Finley | 428/623 |
| 4,898,790 A | 2/1990 | Finley | 428/623 |
| 4,902,580 A | 2/1990 | Gillery | 428/623 |
| 4,948,677 A | 8/1990 | Gillery | 428/623 |
| 4,952,423 A | 8/1990 | Hirata et al. | 427/109 |
| 5,026,597 A | 6/1991 | Franz et al. | 428/323 |
| 5,028,759 A | 7/1991 | Finley | 219/203 |
| 5,059,295 A | 10/1991 | Finley | 204/192.27 |
| 5,110,336 A | 5/1992 | Kadunce et al. | 65/24 |
| 5,240,886 A | 8/1993 | Gulotta et al. | 501/70 |
| 5,330,232 A | 7/1994 | Smith | 283/81 |
| 5,356,718 A | 10/1994 | Athey et al. | 428/428 |
| 5,385,872 A | 1/1995 | Gulotta et al. | 501/71 |
| 5,393,593 A | 2/1995 | Gulotta et al. | 428/220 |
| 5,552,180 A | 9/1996 | Finley et al. | 427/165 |
| 5,593,926 A | 1/1997 | Fujihira | 437/209 |
| 5,618,582 A | 4/1997 | VanWinckel | 427/259 |
| 5,653,903 A | 8/1997 | Pinchok, Jr. et al. | 219/203 |
| 5,688,864 A | 11/1997 | Goodwin | 524/858 |
| 5,776,236 A | 7/1998 | Neuman et al. | 106/287.17 |
| 5,821,001 A | 10/1998 | Arbab et al. | 428/623 |
| 5,830,252 A | 11/1998 | Finley et al. | 65/60.5 |
| 5,860,539 A | 1/1999 | Brown | 211/183 |
| 6,027,766 A | 2/2000 | Greenberg et al. | 427/226 |
| 6,124,044 A * | 9/2000 | Swidler | 428/500 |
| 6,233,972 B1 * | 5/2001 | Foster et al. | 65/60.3 |
| 6,715,316 B2 * | 4/2004 | He et al. | 65/60.3 |
| 6,849,328 B1 * | 2/2005 | Medwick et al. | 428/432 |
| 2003/0143401 A1 | 7/2003 | Hukari et al. | 428/408 |

FOREIGN PATENT DOCUMENTS

| | | |
|---|---|---|
| DE | 2926197 | 1/1981 |
| FR | 2295100 | 7/1976 |

(Continued)

OTHER PUBLICATIONS

U.S. Appl. No. 09/058,440 (see WO 98/58885).

(Continued)

*Primary Examiner*—Archene Turner
(74) *Attorney, Agent, or Firm*—Andrew C. Siminerio

(57) ABSTRACT

A coated article is disclosed. The coated article of the invention includes a substrate having a surface and a removable protective coating comprising up to 100 weight percent of a carbon-containing material deposited over at least a portion of the substrate, where the weight percentages are based on the total weight of the removable protective coating.

14 Claims, No Drawings

| | FOREIGN PATENT DOCUMENTS | | WO | 98/58885 | 12/1998 |
|----|----|----|----|----|----|
| FR | 2 543 514 | 10/1984 | | | |
| GB | 2 145 640 | 4/1985 | | | |
| GB | 2 209 292 | 5/1989 | | | |
| GB | 2302102 | 1/1997 | | | |
| JP | 7567845 | 6/1975 | | | |

OTHER PUBLICATIONS

International Search Report dated Jul. 10, 2006.

* cited by examiner

COATED ARTICLE WITH REMOVABLE PROTECTIVE COATING AND RELATED METHODS

CROSS-REFERENCE TO RELATED APPLICATION

This application is a Continuation-in-Part of U.S. application Ser. No. 09/567,934, filed on May 10, 2000, now U.S. Pat. No. 6,849,328 which is hereby incorporated by reference.

FIELD OF THE INVENTION

The present invention relates generally to removable protective coatings for substrates with and without any functional coating(s) and, more particularly, to removable protective coatings comprised predominantly of a carbon-containing material.

BACKGROUND OF THE INVENTION

Substrates such as glass, plastic, etc. can have two major surfaces terminating at a peripheral edge, with at least one surface having a visible light transmittance ranging from 0% to less than 100%. Some of the substrates, such as a mirror, for example, can have one surface of that transmits visible light and the another surface that reflects visible light. The substrates can be fabricated into various articles and products.

In the glass industry, large glass sheets, for example 4 feet (1.2 m)×6 feet (1.8 m), are prepared by glass manufacturers and then shipped to fabricators who cut the sheets into smaller glass substrates for use in various production articles, such as architectural windows, automotive transparencies, insulated glass (IG) units, mirrors, etc. The glass substrates may or may not include one or more well known functional coatings, such as solar control coatings, conductive coatings, antireflective coatings and/or low emissivity coatings. Fabricators ship the production articles to customers.

Typically, glass manufacturers ship the glass sheets in bulk to the fabricators. For example, the glass sheets can be bundled together and shipped on a pallet or in some other type of specialized shipping containers as is well known in the glass shipping art. Oftentimes, during handling, processing, shipping or storage, the substrate itself and/or a functional coating over the substrate gets damaged.

The present invention provides a novel removable protective coating for substrates, particularly those with some visible light-transmitting characteristics like glass. The removable protective coating of the invention is made up predominantly of a carbon-containing material.

SUMMARY OF THE INVENTION

In a non-limiting embodiment, the present invention is a coated substrate, comprising: a substrate having a surface; and a removable protective coating comprised predominantly of a carbon-containing material deposited over at least a portion of the substrate.

In another non-limiting embodiment, the present invention is a method for protecting a substrate comprising: depositing a removable protective coating comprised predominantly of a carbon-containing material over at least a portion of the substrate.

DESCRIPTION OF THE INVENTION

All numbers expressing dimensions, physical characteristics, quantities of ingredients, reaction conditions, and the like used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all sub-ranges subsumed therein. For example, a stated range of "1 to 10" should be considered to include any and all sub-ranges between (and inclusive of) the minimum value of 1 and the maximum value of 10; that is, all sub-ranges beginning with a minimum value of 1 or more and ending with a maximum value of 10 or less, e.g., 1.0 to 7.8, 3.0 to 4.5, 6.3 to 10.0.

As used herein, spatial or directional terms, such as "left", "right", "inner", "outer", "above", "below", "top", "bottom", and the like, are understood to encompass various alternative orientations and, accordingly, such terms are not to be considered as limiting.

As used herein, the terms "on", "applied on/over", "formed on/over", "deposited on/over", "overlay" and "provided on/over" mean formed, deposited, or provided on but not necessarily in contact with the surface. For example, a coating layer "formed over" a substrate does not preclude the presence of one or more other coating layers of the same or different composition located between the formed coating layer and the substrate. For instance, the substrate can include a conventional coating such as those known in the art for coating substrates, such as glass or ceramic.

As used herein, the term "functional coating" refers to a coating which modifies one or more physical properties of the substrate, e.g., optical, thermal, chemical or mechanical properties, and is not intended to be removed from the substrate during subsequent processing. The functional coating is typically a permanent or "non-removable" coating, i.e. the functional coating is considered to be intrinsic to, or required for, the end-use application of the functionally coated substrate.

As used herein, a coating layer is "homogeneous" when the outer surface or portion (i.e., the surface or portion farthest from the substrate), the inner surface or portion (i.e., the surface or portion closest to the substrate) and the portion between the outer and inner surfaces have substantially the same composition.

As used herein, a coating layer is "gradient" when the coating layer has an increasing weight percentage of one or more components and a decreasing weight percentage of one or more other components when moving from the inner surface to the outer surface or vice versa.

As used herein, a coating layer is "non-homogeneous" when the coating layer is other than homogeneous.

As used herein, the term "low emissivity coating" describes a functional coating that allows visible wavelength energy, i.e. the visible spectrum from 400 nm to 780 nm, to be transmitted through the coating but reflects longer-wavelength infrared energy, and is typically intended to improve the thermal insulating properties of architectural glazings. Typically, a "low emissivity" coating exhibits an emissivity of up to 0.3, for example, up to 0.2.

In a non-limiting embodiment, the present invention is a coated substrate comprising a removable protective coating, i.e., the coating is temporary and is not present on the substrate in its final form. The removable protective coating of the invention can be provided over at least a portion of a substrate or over at least a portion of a functional coating formed on the substrate as described below.

In a non-limiting embodiment of the present invention, the removable protective coating comprises predominantly a carbon-containing material. As is well known in the art, carbon can be present in amorphous form and many crystal structures such as diamond and graphite. As used herein, "predominantly" means at least 50 weight percent carbon, for example at least 75 weight percent carbon, or at least 90 weight percent carbon, or at least 95 weight percent carbon, where the weight percentages are based on the total weight of the removable protective coating. In a non-limiting embodiment of the present invention, the amount of carbon in the material that makes up the removable protective coating ranges from up to 100 weight percent.

According to the present invention, the removable protective coating can be deposited in any conventional manner, such as but not limited to magnetron sputter vapor deposition (MSVD), chemical vapor deposition (CVD), spray pyrolysis (i.e., pyrolytic deposition), atmospheric pressure CVD (APCVD), low-pressure CVD (LPCVD), plasma-enhanced CVD (PEVCD), plasma assisted CVD (PACVD), thermal or electron-beam evaporation, cathodic arc deposition, plasma spray deposition, and wet chemical deposition (e.g., sol-gel, mirror silvering etc.), electron beam, carbon arc deposition, etc.

Examples of suitable CVD coating apparatus and methods are disclosed in U.S. Pat. Nos. 3,652,246; 4,351,861; 4,719,126; 4,853,257; 5,356,718; and 5,776,236, which are hereby incorporated by reference.

Examples of suitable MSVD coating techniques are disclosed in U.S. Pat. Nos. 5,028,759; 4,898,789; 4,948,677; 4,834,857; 4,898,790; and 4,806,220, which are hereby incorporated by reference.

In a non-limiting embodiment of the present invention, the substrate coated in a conventional MSVD coating apparatus. The removable protective coating can be deposited by sputtering a carbon containing sputtering target, e.g. a graphite target such is commercially available from MSI, Co. in Columbus, Ohio, in one of the cathode bays of the coater. The carbon target can be sputtered in any conventional manner to deposit the removable protective coating over the substrate.

In a non-limiting embodiment, the MSVD process can be accomplished by sputtering the carbon target in an atmosphere which is essentially free of oxygen to minimize combustion of the sputtered carbon material. "Essentially free of oxygen" means no more than 20 volume percent oxygen, e.g. no more than 10 volume percent oxygen, or free of oxygen. A suitable non-limiting oxygen free atmosphere comprises argon gas.

The removable protective coating can be deposited at any thickness. For example, the removable protective coating can be deposited at a thickness ranging from up to 50 microns, for example, up to 10 microns, or up to 3 microns, or up to 3000 Å, or up to 350 Å.

According to the present invention, suitable substrates can be made of any material, such as glass, metal, plastic, such as polyacrylates, polycarbonates, and polyethyleneterephthalate (PET), ceramic or mixtures or combinations thereof.

In a non-limiting embodiment of the invention, the substrate is glass. The glass can be, for example, conventional soda lime silicate glass, i.e. "clear glass", or can be tinted or otherwise colored glass, borosilicate glass, leaded glass, tempered, untempered, annealed, or heat strengthened glass. The glass can be of any type, such as conventional float glass or flat glass, and can be of any composition having any optical properties, e.g., any value of visible transmission, ultraviolet transmission, infrared transmission, and/or total solar energy transmission. Examples of suitable glass substrates for the practice of the invention are disclosed in U.S. Pat. Nos. 4,746,347; 4,792,536; 5,240,886; 5,385,872; and 5,393,593, which are hereby incorporated by reference.

The substrate is not limited to any dimensions. For example, the substrate can be larger than about 4 feet (1.2 m) by 5 feet (1.5 m). The substrate can be any thickness. For example, the substrate can have a thickness ranging from 1 mm to 50 mm, for example, from 2 mm to 13 mm, or from 2 mm to 6 mm. The substrate can have any shape. For example, the substrate can be curved, round, or flat.

It will be appreciated by one of ordinary skill in the art that the substrate could be of any type, e.g. rigid, flexible, or even a self-supporting film or web, as long as the substrate is capable of being coated with the removable protective coating of the invention. For example, the substrate can be a conventional spandrel as used in the commercial glass marketplace.

In a non-limiting embodiment where the substrate is glass and will be incorporated into automotive transparencies, such as a windshield, side light, rear light, sun roof, moon roof, etc., the removable protective coating of the invention can be applied over at least a portion of the entire vision area of the substrate, for example, over at least 50% of the vision area, or over at least 80% of the vision area, or over substantially the entire vision area.

In another non-limiting embodiment, the removable protective coating can be applied on a substrate that is used in an architectural glazing. The removable protective coating can be applied over any portion of the substrate.

In a non-limiting embodiment of the present invention, the removable protective coating can be deposited over at least a portion of one or more functional coatings which are deposited over at least a portion of the substrate. The functional coatings can have the same or different composition or functionality. A functional coating can be homogeneous or non-homogeneous. The functional coating can be made up of one or more "films".

In a non-limiting embodiment of the invention, the functional coating can be an electrically conductive coating, such as disclosed in U.S. Pat. Nos. 5,653,903 and 5,028,759, which are hereby incorporated by reference.

In another non-limiting embodiment of the invention, the functional coating can be a solar control coating, for example, a visible, infrared or ultraviolet energy reflecting or absorbing coating. Non-limiting examples of suitable solar control coatings are disclosed in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and in U.S. patent application Ser. No. 09/058,440, which are hereby incorporated by reference.

In yet another non-limiting embodiment of the invention, the functional coating can be a low emissivity coating. The low emissivity coating can be a single layer or a multiple layer coating. The low emissivity coating can comprise one or more metals, non-metals, semi-metals, semiconductors, and/or alloys, compounds, composites, combinations, or blends thereof. Non-limiting examples of low emissivity coatings are disclosed in U.S. Pat. Nos. 4,952,423 and 4,504,109 and British reference GB 2,302,102, which are hereby incorporated by reference.

Non-limiting examples of suitable functional coatings for use with the present invention are commercially available from PPG Industries, Inc. of Pittsburgh, Pa. under the SUNGATE® and SOLARBAN® families of coatings.

The functional coating(s) can be deposited using any of the conventional techniques as described above in relation to the removable protective coating.

In a non-limiting embodiment of the invention, a blocking layer is deposited over the functional coating to prevent the removable protective coating from damaging the functional coating. More specifically, if the blocking layer is not used, the carbon-containing removable protective coating could chemically reduce the upper portion of the functional coating, i.e. the carbon in the removable protective coating would draw oxygen atoms out of the functional coating to form oxides of carbon. The blocking layer comprises a material which prevents chemical reduction of the functional coating by the removable protective coating but does not adversely impact the transmission or vision characteristics of the coated article. In a non-limiting embodiment of the present invention, the blocking layer is selected from oxides, nitrides and oxynitrides of silicon, titanium, zirconium, niobium, aluminum, hafnium, yttrium, lanthanum and mixtures thereof.

The blocking layer can be deposited using any of the conventional techniques described above in relation to the removable protective coating. The blocking layer can be deposited at a thickness up to 50 microns, for example, up to 25 microns, or up to 10 microns, or up to 3.0 microns, or up to 1.7 microns, or up to 0.5 microns.

In a non-limiting embodiment of the invention, the blocking layer comprises silica having a thickness ranging from 25 Å to 500 Å, for example 50 Å.

A coated substrate according to the present invention can be shipped to a fabricator for further processing as discussed above. Generally, the removable protective coating will be removed by the fabricator. The removable protective coating can be removed without damaging the underlying substrate, functional coating(s) or blocking layer, if used.

In a non-limiting embodiment of the invention, the removable protective coating can be removed by combustion. For example, where the substrate is a glass sheet, the removable protective coating can be removed in a glass tempering oven, which is typically operated at a temperature of greater than 1000° F. (538° C.). The combustion temperature of the removable protective coating should not be greater than the softening temperature of the substrate. During tempering, the carbon-containing material that makes up the removable protective coating is combusted and removed from the substrate.

In other non-limiting embodiments of the invention, the removable protective coating can be removed using a liquid solvent or by wiping, spraying or dipping the coated substrate in an aqueous or non-aqueous solvents, e.g. organic, alkaline, or acidic solvents.

In addition to the coated substrates discussed above, the present invention encompasses methods for making the coated substrates. In a non-limiting embodiment, the present invention is a method for protecting a substrate comprising depositing a removable protective coating comprised predominantly of a carbon-containing material over at least a portion of a substrate as discussed above.

A coated substrate according to the present invention having a removable protective coating that is comprised predominantly of a carbon-containing material demonstrates several benefits over coated substrates without the removable protective coating. First, the carbon-containing material can protect a functional coating very well because carbon is chemically inert at room temperature. This results in a coated product having an increased shelf life. Second, the carbon in the removable protective coating can increase the radiative heat transfer to the substrate by reducing the amount of heat energy reflected from the functional coating and by functioning as a heat absorbing layer. This can enable the coated substrate to exhibit improved heat processing characteristics during tempering, heat strengthening, bending, etc. For example, the tempering time for a coated substrate according to the present invention can be less than that required for a coated article that does not contain the removable protective coating of the present invention. Third, the removable temporary coating of the present invention can act as a barrier to certain materials like oxygen.

EXAMPLES

The present invention is illustrated by the following non-limiting example. A coated substrate according to the present invention was prepared as follows. A clear, float glass substrate coated with Sungate® coating, which is commercially available from PPG industries, having a thickness of 1.8 mm was coated using an Airco ILS-1600 coater with planar magnetron cathodes. The substrate was at ambient temperature.

A blocking layer was deposited over the substrate by conveying it under an Si—Al target comprising 15 wt. % aluminum and 85 wt. % silicon in an atmosphere made up of 80% oxygen and 20% argon gas at a line speed of 120 inches per minute. The base pressure in the deposition chamber was in the low $10^{-5}$ torr range and the operating pressure was 4 microns. The Si—Al target was run at a power setting of 2.0 kilowatts, with a voltage of 320 volts and a current of 6.4 amps. The transmission was 70.1% after 2 passes under the target and the thickness was approximately 60 Angstroms.

Next, the removable protective coating of the present invention was applied by sputtering depositing a graphite target in a 100% argon gas atmosphere. The graphite target was run at a power setting of 4.0 kilowatts, with a voltage of 686 volts and a current of 5.8 amps. The transmission was 29.8% after 6 passes under the target and the thickness was measured to be 250 Angstroms.

It will be readily appreciated by those skilled in the art that modifications can be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A coated substrate, comprising:
  a substrate having a surface; and
  a removable protective coating comprised predominantly of a crystalline or amorphous carbon-containing material deposited over at least a portion of the substrate; and
  a functional coating deposited over the substrate, wherein the functional coating is between the substrate and the removable protective coating.

2. The coated substrate according to claim 1, wherein the removable protective coating comprises at least 75 weight percent carbon.

3. The coated substrate according to claim 1, the removable protective coating has a thickness ranging up to 10 microns.

4. The substrate according to claim 3, the removable protective coating has a thickness ranging up to 3000 Å.

5. The substrate according to claim 1, wherein the substrate is selected from untempered glass, tempered glass, and heat-strengthened glass.

6. The substrate according to claim 1, wherein the functional coating comprises a low emissivity coating.

7. The substrate according to claim 1, further comprising a blocking layer over the functional coating, wherein the blocking layer is between the functional coating and the removable protective coating.

8. The substrate according to claim 7, wherein the blocking layer is selected from oxides, nitrides, oxynitrides of silicon, titanium, zirconium, niobium, aluminum, and mixtures thereof.

9. The substrate according to claim 7, wherein the blocking layer has a thickness ranging up to 50 microns.

10. The substrate according to claim 9, wherein the blocking layer has a thickness ranging from 25 Å to 500 Å.

11. The substrate according to claim 1, wherein the protective coating is a sputter deposited coating.

12. A coated substrate, comprising:
    a glass substrate having a surface;
    a low emissivity coating formed over at least a portion of the substrate surface; and
    a protective coating sputter deposited over at least a portion of the low emissivity coating, the protective coating comprising crystalline or amorphous carbon.

13. The substrate according to claim 12, further comprising a blocking layer positioned between the low emissivity coating and the protective coating.

14. The substrate according to claim 13, wherein the blocking layer comprises a material selected from the group consisting of oxides, nitrides, or oxynitrides of silicon, titanium, zirconium, niobium, aluminum, and mixtures thereof.

* * * * *